United States Patent
Trantham et al.

(10) Patent No.: US 11,922,055 B2
(45) Date of Patent: Mar. 5, 2024

(54) STACK REGISTER HAVING DIFFERENT FERROELECTRIC MEMORY ELEMENT CONSTRUCTIONS

(71) Applicant: Seagate Technology LLC, Fremont, CA (US)

(72) Inventors: Jon D. Trantham, Chanhassen, MN (US); Praveen Viraraghavan, Chicago, IL (US); John W. Dykes, Eden Prairie, MN (US); Ian J. Gilbert, Chanhassen, MN (US); Sangita Shreedharan Kalarickal, Eden Prairie, MN (US); Matthew J. Totin, Excelsior, MN (US); Mohamad El-Batal, Superior, CO (US); Darshana H. Mehta, Shakopee, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 127 days.

(21) Appl. No.: 17/730,345

(22) Filed: Apr. 27, 2022

(65) Prior Publication Data
US 2022/0350523 A1   Nov. 3, 2022

Related U.S. Application Data

(60) Provisional application No. 63/201,395, filed on Apr. 28, 2021.

(51) Int. Cl.
*G11C 11/22* (2006.01)
*G06F 3/06* (2006.01)

(52) U.S. Cl.
CPC .......... *G06F 3/0655* (2013.01); *G06F 3/0604* (2013.01); *G06F 3/0679* (2013.01); *G11C 11/22* (2013.01)

(58) Field of Classification Search
CPC ..................................................... G11C 11/22
See application file for complete search history.

(56) References Cited

U.S. PATENT DOCUMENTS 3,493,935 A    2/1970  Questa
5,687,336 A *  11/1997  Shen ................... G06F 9/3816
                                              712/E9.046

(Continued)

FOREIGN PATENT DOCUMENTS

JP          2003229541 A      8/2003

*Primary Examiner* — Douglas King
(74) *Attorney, Agent, or Firm* — HOLZER PATEL DRENNAN (57) ABSTRACT

Apparatus and method for managing data in a processing system, such as but not limited to a data storage device such as a solid-state drive (SSD). A ferroelectric stack register memory has a first arrangement of ferroelectric memory cells (FMEs) of a first construction and a second arrangement of FMEs of a different, second construction arranged to provide respective cache lines for use by a controller, such as a programmable processor. A pointer mechanism is configured to provide pointers to point to each of the respective cache lines based on a time sequence of operation of the processor. Data sets can be migrated to the different arrangements by the controller as required based on the different operational characteristics of the respective FME constructions. The FMEs may be non-volatile and read-destructive. Refresh circuitry can be selectively enacted under different operational modes.

20 Claims, 4 Drawing Sheets

(56) References Cited

U.S. PATENT DOCUMENTS

| | | |
|---|---|---|
| 7,099,993 B2 | 8/2006 | Keeler |
| 7,599,208 B2 | 10/2009 | Kang |
| 8,949,580 B2 | 2/2015 | Li et al. |
| 9,190,124 B2 | 11/2015 | Fanning et al. |
| 9,552,288 B2 | 11/2017 | Goss et al. |
| 2007/0091679 A1* | 4/2007 | Nishihara .......... G11C 16/0483 365/185.11 |
| 2020/0365618 A1 | 11/2020 | Zhang et al. |

* cited by examiner

FERROELECTRIC TUNNEL JUNCTION (FTJ)

FIG. 6

FeRAM (1T-1C) FERROELECTRIC CAPACITOR MEMORY CELL

FIG. 7

FeFET MEMORY CELL

STACK REGISTER HAVING DIFFERENT FERROELECTRIC MEMORY ELEMENT CONSTRUCTIONS

RELATED APPLICATION

The present application makes a claim of domestic priority under 35 U.S.C. 119(e) to U.S. Provisional Patent Application No. 63/201,395 filed Apr. 28, 2021, the contents of which are hereby incorporated by reference.

SUMMARY

Various embodiments of the present disclosure are generally directed to a stack register formed of ferroelectric memory elements (FMEs), such as but not limited to FeRAM (ferroelectric random access memory), FTJs (ferroelectric tunnel junctions) and FeFETs (ferroelectric field effect transistors).

In some embodiments, A ferroelectric stack register memory has a first arrangement of FMEs of a first construction and a second arrangement of FMEs of a different, second construction arranged to provide respective cache lines for use by a controller, such as a programmable processor. A pointer mechanism is configured to provide pointers to point to each of the respective cache lines based on a time sequence of operation of the processor. Data sets can be migrated to the different arrangements by the controller as required based on the different operational characteristics of the respective FME constructions. The FMEs may be non-volatile and read-destructive. Refresh circuitry can be selectively enacted under different operational modes.

These and other features and advantages of various embodiments can be understood from a review of the following detailed description in conjunction with the accompanying drawings.

DETAILED DISCUSSION

Various embodiments of the present disclosure are generally directed to systems and methods for providing a stack register memory formed of ferroelectric memory elements (FMEs).

FMEs are semiconductor based memory elements that provide non-volatile data storage with fast response and low power consumption characteristics. Depending on construction, an FME can include various semiconductor layers such as one or more of a conductive electrode, a ferroelectric layer, a tunneling layer, a dielectric layer, a channel layer, a drain, source and gate region, etc. Data bit(s) are stored by an FME in relation to a programmed electric polarity that is stored in one or more ferroelectric layers of the element.

Different electrical polarities provide different current densities through the memory element as current is passed through the programmed ferroelectric layer. In this way, FMEs can be considered to operate in a manner similar to resistive random access memory (RRAM), phase change memory, spin-torque memory, etc., where a programmed state can be detected based on different electrical responses (e.g., different conductivity, current density, resistance, voltage drop, etc.) across the element. As with these elements, FMEs tend to be non-volatile and therefore retain the stored programmed bit configuration even in the absence of applied power.

A variety of FME constructions have been proposed. These include ferroelectric tunneling junctions (FJTs), ferroelectric field effect transistors (FeFETs), and ferroelectric random access memory (FeRAM). Other forms of FMEs have been proposed as well.

Generally, FTJs are somewhat analogous to magnetic tunneling junctions (MTJs) and are usually arranged as two-junction cells with a ferroelectric layer and a tunneling barrier layer sandwiched between opposing electrodes. FTJs are particularly suitable for cross-point arrays and other architectures with two connection points to each memory element.

FeFETs are somewhat analogous to flash memory cells and generally include a gate structure arranged between respective source and drain doped regions. The gate structure includes a ferroelectric layer. FeFETs usually have three-junctions (drain, source, gate) and can be readily arranged into two-dimensional (2D) or three-dimensional (3D) structures.

FeRAM cells are somewhat analogous to DRAM cells and are usually arranged with at least one transistor and at least one capacitor. The capacitor includes a ferroelectric layer. A tunneling barrier layer may also be provided in the capacitor as well. A number of FeRAM arrangements have been proposed, including 1T1FC (one-transistor, one-ferroelectric capacitor) cells, 2T2C cells, 1T4C cells, 6T4C cells, etc. The transistor in each FeRAM cell may be a traditional transistor (e.g., a conventional field effect transistor, FET), although in some cases ferroelectric layer(s) can be applied to the gate structure of the transistor as well as to the capacitor ("dual layer FeRAM").

A variety of materials, metals and alloys can be used to make up the respective ferroelectric, tunneling and electrode layers. Suitable materials for the ferroelectric layer can include, without limitation, HfO2, ZrO2, Hf1−xZxO2, etc. These materials may be doped with other elements such as but not limited to Si, Ge, Al, Ti, Sc, Y, La, Ce, Gd, Nb, Sr, Ba, N, etc. The tunneling layer(s) may be a suitable non-ferroelectric dielectric including, but not limited to Al2O3, MgO, SrTiO3, etc. Electrodes are electrically conductive material and may include, without limitation, TiN, TaN, Pt, Ag, CrRu, CrMo, CrW, CrTi, and RuAl. In some cases, anti-ferroelectric materials such as ZrO2 may be used in the place of the ferroelectric layer if an internal bias field, e.g., from two dissimilar electrodes, is introduced in order to shift its hysteresis loop to enable the storage of binary information. These and other examples are merely illustrative and are not limiting.

A programmable processor is a complex electronic circuit with the capability of performing executable instructions stored in a local memory. A commonly employed form of memory useful by a processor is a stack register, which is a memory configured to maintain data (e.g., instructions, control parameters, etc.) in a stack. While not required, most stacks are logically arranged such that information elements are pushed to the stack and pulled from the stack in selected orders. A pointer mechanism is used to track the locations of various entries in the stack.

In this way, a stack register can be thought of in some applications as a "stack" of data entries that are at least logically "pushed down" into the stack as the entries are added, and then "pulled out" from the stack as needed. While it is possible to maintain a stack register such that the various data bits physically move up and down, so to speak, among physically oriented memory cells, it is more common for these movements to be carried out virtually. In this latter case, the pointers are used to identify the location of the "top" of the stack, and a virtual order of the stack is maintained among the physical memory locations.

While one particularly useful form of stack register is in the area of local memory (e.g., L1, L2 cache, etc) for a programmable processor, other forms of stack registers have been employed throughout a number of operational environments, including in areas of a data storage device at various locations in a data pipeline as data are processed for storage to a main memory and as data are retrieved and processed from the main memory for relocation or presentation to a host (client) device.

Ferroelectric memory provides a number of advantages over existing memory types, including the promise of providing transfer speeds that meet or exceed those of volatile DRAM (dynamic random access memory) and wear capabilities exceeding those of flash. There is accordingly a need to incorporate ferroelectric memory in traditional areas where these and other forms of conventional memory have been utilized, including in the area of stack memories.

The present disclosure is generally directed to forming a stack register memory of FMEs having different response characteristics. The disclosure contemplates different available FME constructions with different resonance characteristics to meet the needs of a given operational environment. In some cases, a multi-layer construction may be provided, with the stack order selected based on various internal and external parameters. This solution provides the flexibility to provide the necessary storage and pointer (tracking) capabilities to manage a data/instruction set while taking advantage of different types of FME responses. Both two dimensional (2D) and three dimensional (3D) arrangements can be used.

Figure 1:
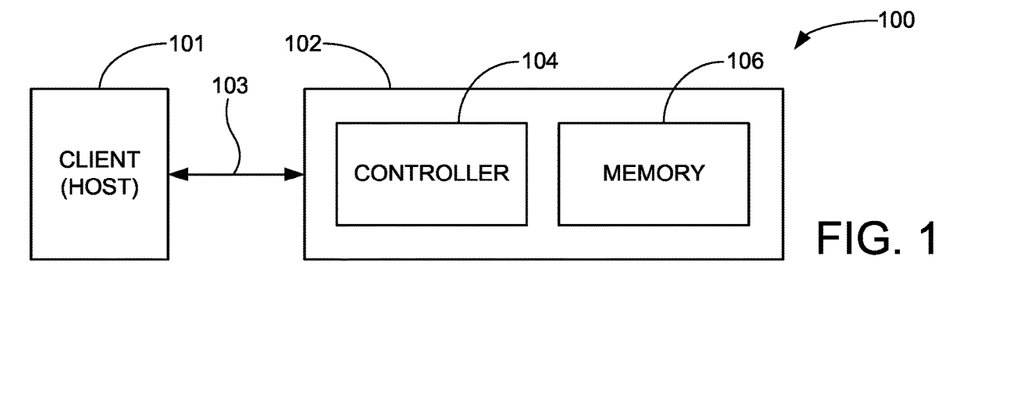
FIG. 1 is a functional block diagram of a data processing system constructed and operated in accordance with various embodiments.

These and other features and advantages of various embodiments can be understood beginning with a review of FIG. 1, which shows a functional representation of a data processing system 100. The system 100 includes a client (host) device 101 that communicates with a data storage device 102 via an interface 103. The client device 101 may take the form of a personal computer, a smart phone, a workstation, a tablet, a laptop, a gaming system, a microcontroller, a server, an edge device, an Internet of Things (IoT) device, a mass storage array, etc.

The data storage device 102 is configured to store and retrieve data utilized by the user of the client device 101 and may be a local processor memory, a data cache, a server cache, a RAID storage system, a cloud storage system, a solid-state drive (SSD), a hard disc drive (HDD), a hybrid storage device, an array of storage devices, a portable thumb (e.g., USB) drive, etc. The interface 103 can take substantially any form including but not limited to a local wired or wireless interface, a local area network (LAN), a wide area network (WAN), a cloud computing interface, the Internet, etc. Substantially any useful interface protocol can be implemented for the interface 103 including Ethernet, USB, SCSI, SAS, Fibre Channel, PCMI, wireless connections, etc.

Of interest is the data storage device 102, which is shown to include a controller 104 and a memory 106. The controller 104 can include one or more programmable processors that execute program instructions stored in a local memory to carry out various functions, including the control of data transfers between the memory 106 and the client 101 across the interface 103. Additionally or alternatively, the controller 104 can utilize a hardware circuitry based processor such as formed of ASIC (application specific integrated circuits), FPGA (field programmable gate arrays), system on chip (SOC), state machines, or other arrangements of gate logic.

The memory 106 can include any number of useful forms including local memory for the controller, cache memory, buffer, main storage, etc. The memory 106 includes non-volatile memory (NVM), which will be understood, consistent with the customary usage of this term, as persistent memory that continues to retain information stored therein even after the removal of applied power to the memory. The form of the main data store can take any number of forms, including semiconductor based memory, rotatable data storage memory, tape based memory, etc.

Figure 2:
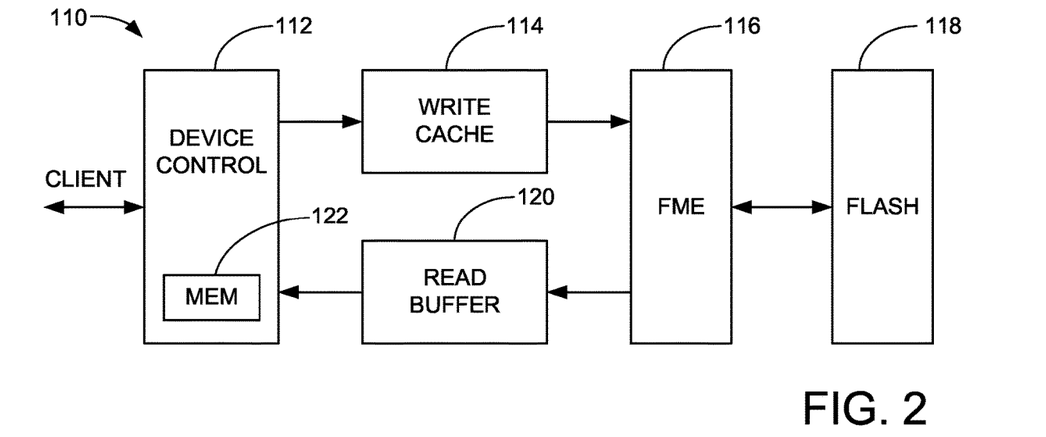
FIG. 2 is a functional block representation of the data storage device of FIG. 1 characterized as a solid-state drive (SSD) in some embodiments.

FIG. 2 depicts aspects of a data storage device 110 that corresponds to the data storage device 102 of FIG. 1 in some embodiments. In FIG. 2, the data storage device 110 is characterized as a solid-state drive (SSD) that utilizes flash memory as a main memory store. This is not limiting, as any number of other forms of data storage devices can be utilized, including but not limited to hard disc drives (HDDs), hybrid drives, tape drives, optical drives, magneto-optical (MO) drives, etc. Moreover, while flash memory forms the main memory store, other semiconductor memory types, including but not limited to ferroelectric memory, can be used.

The SSD 110 includes a device controller 112 that corresponds to the controller 104 in FIG. 1. A write cache 114 is an internal buffer memory that temporarily stores sets of write data provided from the external host prior to transfer to the main store. These sets of write data may accompany a write command from the requesting client to store the data for future use.

A flash memory electronics (FME) circuit 116 receives and processes the sets of write data for transfer to a flash array 118. A read buffer 120 temporarily stores corresponding sets of read back data retrieved from the flash array 118, via the FME 116, in response to a read command. The read back data are subsequently transferred from the read buffer 120 to the requesting client that issued the read command. Internal controller memory (MEM) 122 may store program instructions, data queues, command queues, map data, and other forms of control data to facilitate these operations.

Figure 3:
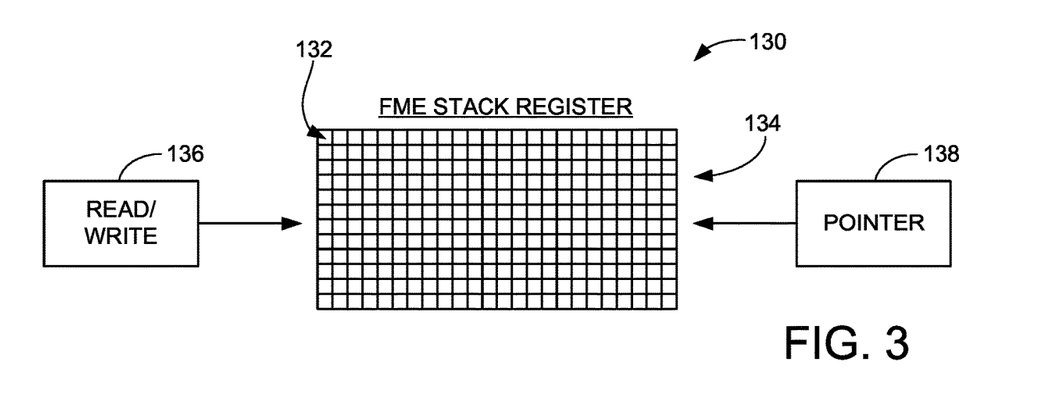
FIG. 3 shows a stack register formed of FME elements that can be incorporated into the data storage devices of FIGS. 1 and 2 in accordance with some embodiments.

FIG. 3 shows an FME stack register memory 130 that can be incorporate into any of the above memory element locations of the SSD 110 of FIG. 2. This can include but is not limited to the controller 112, the write cache 114, the FME 116, the flash memory 118, the read buffer 120 and/or the embedded memory 122. The FME stack register memory 130 can be incorporated into other operational environments as well, including but not limited to client and data storage devices as shown in FIG. 1.

The stack register 130 includes a number of FME cells 132 that are sequentially arranged along various addressable cache lines 134, represented by each "row" in the register. Any number of sequentially, serially connected cells can be provided as desired along each cache line. A read/write circuit 136 writes multibit data ("entries") to the various cache lines 134. A pointer circuit 138 tracks the various locations of the data within the stack. While some arrangements store a single bit of data in each cell, such is not necessarily required; more than one bit, or less than one bit, can be provisioned per cell using known techniques.

At this point it will be expressly understood that each of the cells 132 in the stack register are FME cells, so that the cells each have at least one ferroelectric layer configured to store data, the cells are non-volatile, and in most cases the cells are contemplated as being read destructive (e.g., once read, a refresh operation is required to replenish the data to return the previously stored data to the array). However, various alternative configurations are contemplated as described below, including stack registers that have FMEs of different configurations, cells that are FME based and non-FME based, cells with specially configured refresh characteristics, and so on.

At this point it will be recognized that it is common to describe a "stack" of memory from a physical standpoint, particularly in the context of a three-dimensional (3D) arrangement of memory cells, for which FMEs are particularly suited and which are expressly contemplated in some embodiments. However, in the context of a "stack register" or similar memory configuration, the idea of "stacking" does not so much relate to the physical location of the data, but instead relates to the functional stacking of the data. Usually, the basis for differentiation of data in a stack register is a time-basis; that is, a typical stack register operates like a FIFO (first in, first out) style buffer, so that a relative local priority or sequencing is maintained. However, other functional bases of data sequence can be used, such as source, priority, etc.

Figure 3A:
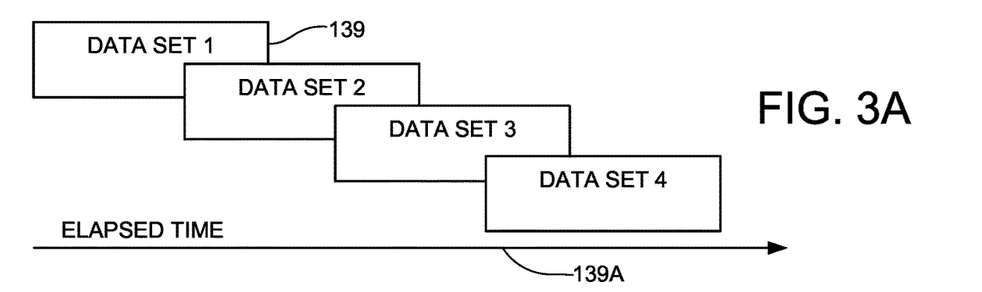
FIG. 3A shows a time sequence of data sets written to the stack register of FIG. 3 in accordance with some embodiments.

A time-based priority arrangement is depicted in FIG. 3A, which shows various data sets 139 that have been stored to a stack register such as 130 in FIG. 3. As depicted in FIG. 3A, a first data set (Data Set 1) is written first, followed by a second data set (Data Set 2), a third data set (Data Set 3), a fourth data set (Data Set 4), and so on. Elapsed time is indicated by arrow 139A. From a time standpoint, Data Set 4 is the most recently stored data set and Data Set 1 is the oldest data set resident in the memory stack. However, it does not necessarily matter where these data sets are physically located within the register 130, so long as the time (or other sequence base) is maintained.

In this way, data are pushed onto the stack and pulled from the stack as required. Because of the fast response, non-volatility and low power characteristics of FMEs, it is possible to physically migrate data through the stack as required so that data are transferred from one cache line to the next. In other words, while physical location may not be necessarily required to maintain ordering, there are situations where it may be useful to physically migrate data sets (such as those shown in FIG. 3A) to different locations within a stack register. This may be particularly advantageous in constructions that use different types of FMEs, as explained below.

Returning to FIG. 3, each cell 132 in the stack register 130 includes at least one ferroelectric memory layer configured to store a data in the form of one, a portion of one, or multiple, data bits. The data bits are stored in relation to electrical orientation (polarization) of the respective layers. The bits are read in and out as required during use of the stack register. Because FMEs are usually rewritable in place (e.g., do not normally require a separate erasure operation before new data can be written), older data can be jettisoned either by overwriting with new data, by overwriting with a baseline pattern (e.g., all zeros, etc.). As some FME constructions are read destructive, older data can also be jettisoned by simply reading and not refreshing the cells.

Figure 4:
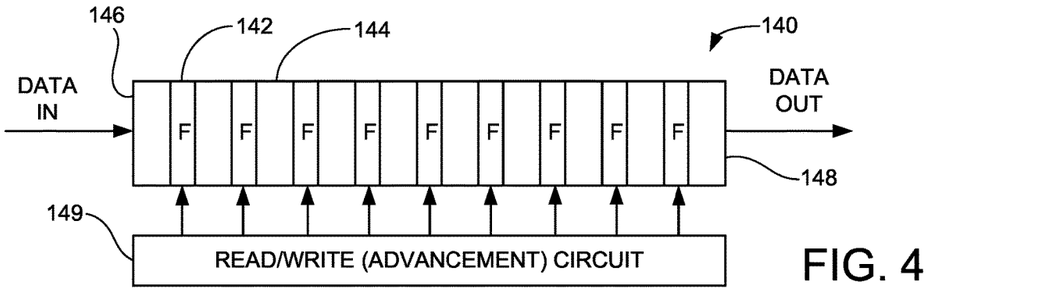
FIG. 4 shows another ferroelectric based stack register constructed and operated in accordance with some embodiments.

FIG. 4 shows another stack register 140 in accordance with some embodiments. A single cache line is depicted made up of spaced apart ferroelectric memory layers (F) 142 that are spaced apart from other elements/layers 144. Data can be sequentially input and retrieved as shown. Each memory layer 142 stores one or more bits along the cache line. A first end of the register 140 is denoted at 146, and a second end of the register is denoted at 148. In some cases, read/write circuitry 149 can be used to propagate data bits through the stack register from the first end 146 to the second end 148. This can include operations to read a given programming state of a given memory layer 142 and advance (write) that state to the next layer.

Figure 5:
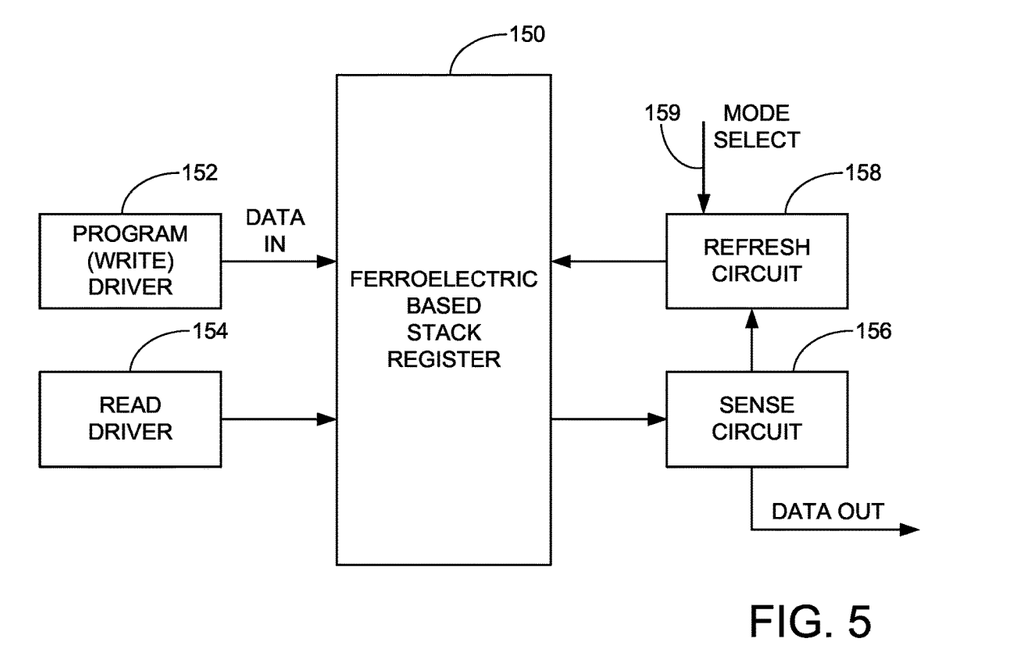
FIG. 5 shows yet another ferroelectric based stack register to illustrate various control circuits used to access data bits therein in accordance with some embodiments.

FIG. 5 shows additional aspects of another ferroelectric based stack register 150 in accordance with further embodiments. FIG. 5 shows various additional circuitry used to manage the ferroelectric programmed state of the various ferroelectric layers of the memory. This circuitry includes a program (write) driver 152, a read driver 154, a sense circuit 156 and a refresh circuit 158.

The program driver 152 is utilized to write (program) data to the respective memory cells of the stack on a cache line basis. This can include the presentation of appropriate voltages and/or currents on the control lines to place the associated ferroelectric layers in the desired programmed orientations.

The read driver 154 places appropriate voltages and/or currents on the respective control lines to enable the sense circuit 156 to sense the programmed orientations of the respective ferroelectric layers.

The refresh circuit 158 operates to refresh the current programmed states of the ferroelectric layers 402 at appropriate times. In some cases, the refresh circuit 158 operates at the conclusion of each read operation, since a read operation destroys the currently stored state in those cases where the FME cells are read-destructive. In this situation, once data are read from a selected location in the ferroelectric layers, the refresh circuit buffers and rewrites the previously stored data back to that selected location from which the data retrieved (as is commonly performed with DRAM). That is, as data bits are stored within the stack, data bits may need to be rewritten (or not) as the data are read.

However, in further embodiments, the refresh circuit 158 can be made to be selectively operable in different modes, so that, responsive to a mode select (enable/inhibit) signal 159 from an associated control circuit, the refresh circuit 158 can operate to selectively rewrite, or not, the data read from the register. This can be useful in a variety of applications such as power down events, detected attacks, one-time programming applications, crypto systems, etc. For example, in a first mode the refresh circuit 158 may operate to automatically refresh the data in the FME after a read operation; and in a second mode the refresh circuit 158 does not refresh the data in the FME after a read operation.

Figure 6:
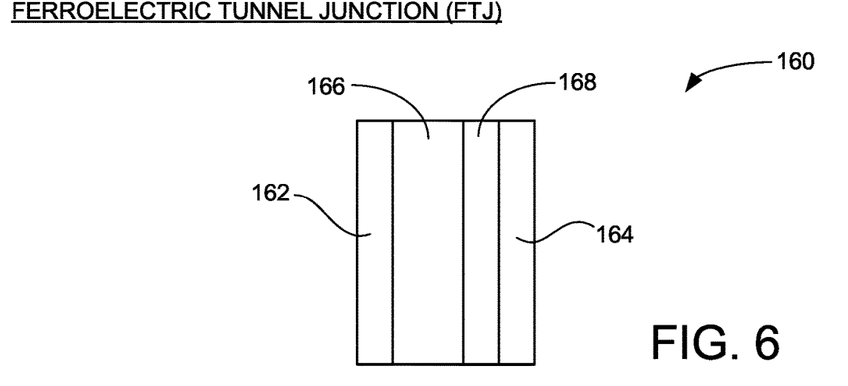
FIG. 6 is a functional block diagram of an FME configured as a ferroelectric tunneling junction (FTJ).

FIG. 6 shows a construction of each cell 132 of the stack registers presented herein as an FTJ 160. The FTJ 160 is a two-terminal device with outer conductive electrode layers 162 164, an inner (programming) layer of ferroelectric material 164, and an optional tunnel barrier layer 166. The tunnel barrier layer 168 is contemplated but not necessarily required as a separate layer, and may be any suitable material such as but not limited to a non-ferroelectric material, a dielectric material, etc.

With the appropriate choice of electrode materials, tunnel barrier, and ferroelectric layer, the resistance of the FTJ can be made to depend on the orientation of the ferroelectric polarization of the ferroelectric layer 166. Stated another way, an FTJ such as the FTJ 160 operates in a manner similar to magnetic tunnel junctions (MTJs), and will present different electrical resistances between electrodes 162, 164 based on the programmed polarization of the ferroelectric layer 166. The differences in electrical resistance will vary depending on construction, but differential resistance values can be greater than $10^4$ ohms.

Figure 7:
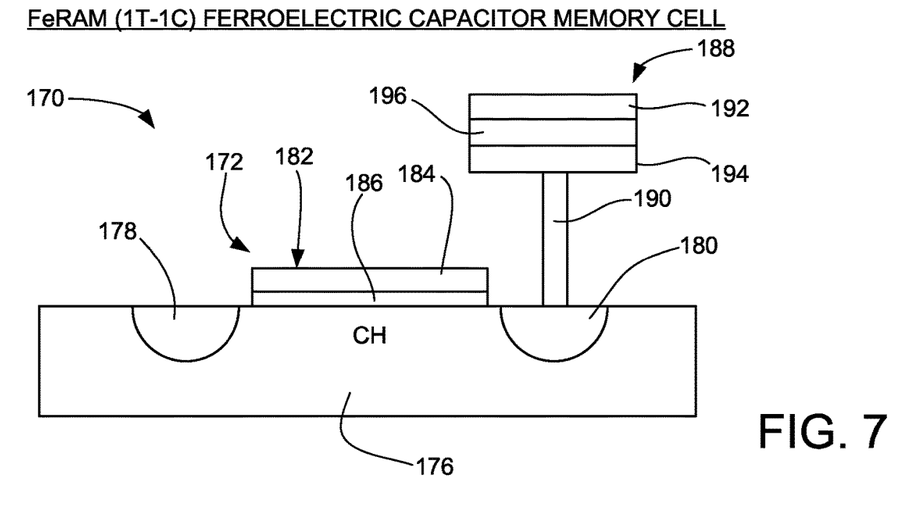
FIG. 7 is a functional block diagram of an FME configurated as an FeRAM memory element having a transistor and a capacitor.

FIG. 7 shows another example construction for each of the memory cells 132 in FIG. 3 as FeRAM cells 170. Each FeRAM cell 170 is characterized as a 1T1C arrangement, although other configurations can be used. The FeRAM cell 170 includes at least one transistor 172 and at least one capacitor 174. Each transistor 172 is formed using a base semiconductor substrate 176 with respective doped regions 178, 180 to form respective source and drain regions. A channel (CH) is formed between these respective regions, as shown. A gate structure 182 is disposed between the source and drain regions 178, 180 adjacent the channel region. The gate structure 182 includes a conductive gate 184 and an isolating region 186.

A capacitor structure 188 extends from the drain region 180 via conductive path 190. The capacitor structure includes upper and lower electrode layers 192, 194. A ferroelectric layer 196 is disposed between the electrode layers 190, 192. As desired, a tunneling layer (not separately shown) can also be provided between the electrode layers. In this way, the control gate voltage applied to electrode conductive gate 184 can be used to determine the electric polarity of ferroelectric layer 196 in relation to the amount of voltage required to place the transistor into a forward conductive state from source to drain 178, 180.

Figure 8:
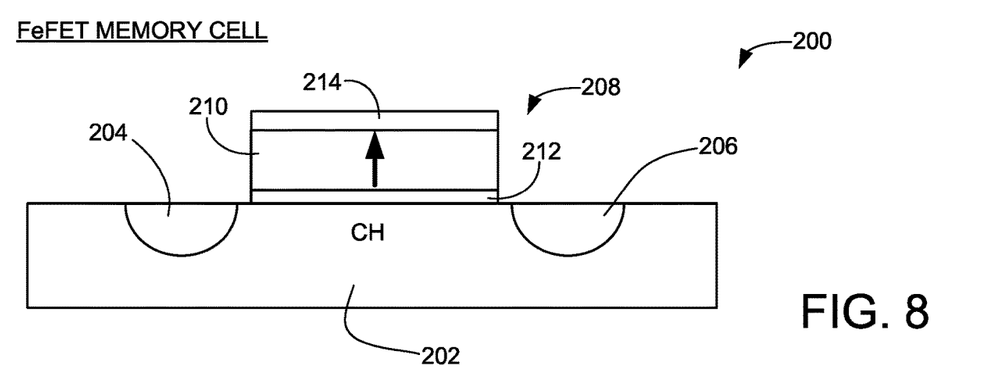
FIG. 8 is a functional block diagram of an FME configurated as an FeFET having a ferroelectric layer.

FIG. 8 shows an FME memory cell element configured as an FeFET 200. The FeFET 200 includes a semiconductor substrate 202 in which doped regions 204, 206 are formed to provide respective source and drain regions. A gate structure 208 is provided between the source and drain regions 204, 206 to manage a channel (CH) therebetween. The gate structure 208 includes a ferroelectric layer 210 sandwiched between an isolating layer 212 and an electrically conductive gate layer 214. It will be noted that a number of different gate structures are known for FeFETs, including a single layer of ferroelectric material, the addition of an insulative layer (as shown), the addition of a metal layer, a laminated arrangement with multiple spaced apart ferroelectric layers, and so on. While the FTJs 160 and FeRAM 170 of FIGS. 6-7 may be read destructive, the FeFETs 200 of FIG. 8 are often not read destructive.

Figure 9:
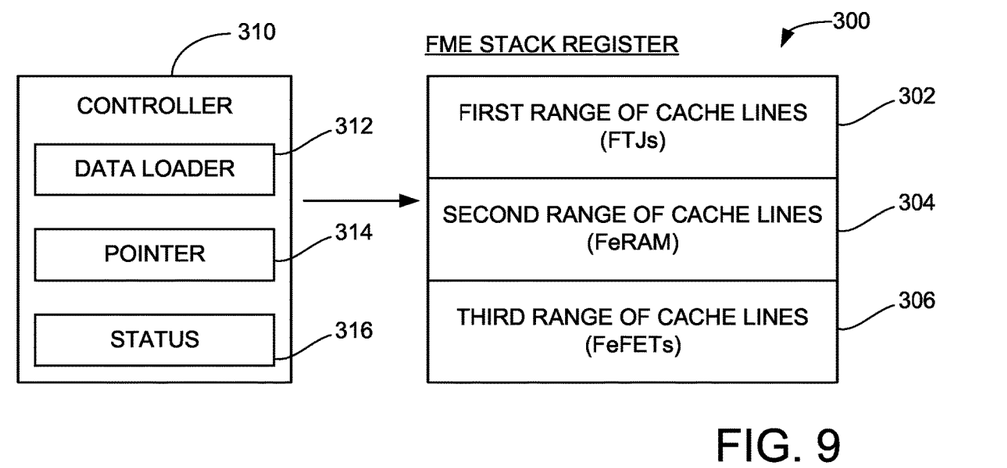
FIG. 9 shows another ferroelectric stack register having cache lines formed of different constructions of FMEs in accordance with further embodiments.

FIG. 9 shows another FME stack register 300 in accordance with some embodiments. The stack register 300 takes a hybrid construction in that the stack register has different regions formed of different types of FMEs such as those depicted in FIGS. 6-8. More specifically, the exemplary stack register 300 has a first range of cache lines 302 formed of FTJs 160, a second range of cache lines 304 formed of FeRAM 180, and a third range of cache lines 306 formed of FeFETs 200. Other arrangements can be used.

Coupled to the stack register 300 is a controller 310. The controller 310 may be similar to the controllers discussed above and may include a hardware or programmable processor. Elements of the controller 310 include a data loader 312, a pointer 314 and a status circuit 316. The data loader 312 manages the loading (and, as desired, migration, reading and removal) of the data to the respective cache lines. The pointer 314 provides pointing functions, including tracking of the addresses of the cache lines to which various data values (entries) are located. The pointer circuitry may utilize one or more data structures in memory in order to track the locations of the various data sets in the stack register 300, as well as other control data such as aging, priority, status, etc. The status circuit 316 further manages the contents of the cache lines, including managing overall capacity, marking data as stale, etc.

In this way, the controller 310 can utilize different regions of the stack register to store data in accordance with the characteristics of the associated construction of the stack register cache lines. For example, the FTJs may provide faster response but shorter persistence as compared to the FeFETs, so shorter term data may be provided to range 302 as compared to range 306.

It will be appreciated that circuitry such as depicted in FIG. 9 utilize the stack register to store substantially any type of information to the stack register, including but not limited to program instructions, data values, control parameters, etc. Data transfers can be carried out at a very high speed to generate a throughput at substantially any desired throughput rate. At the same time, the NVM characteristics of the layers means that the data rate can be adjusted, slowed, or sped up as required to meet the requirements of other aspects of the system. Each layer can store a single bit, multiple bits or a portion of a bit, as required. In some cases, data sets can be promoted to a higher level in the cache or demoted to a lower level in the cache so that the data are transferred from FMEs having a first type of construction to FMEs having a different, second type of construction.

Figure 10:
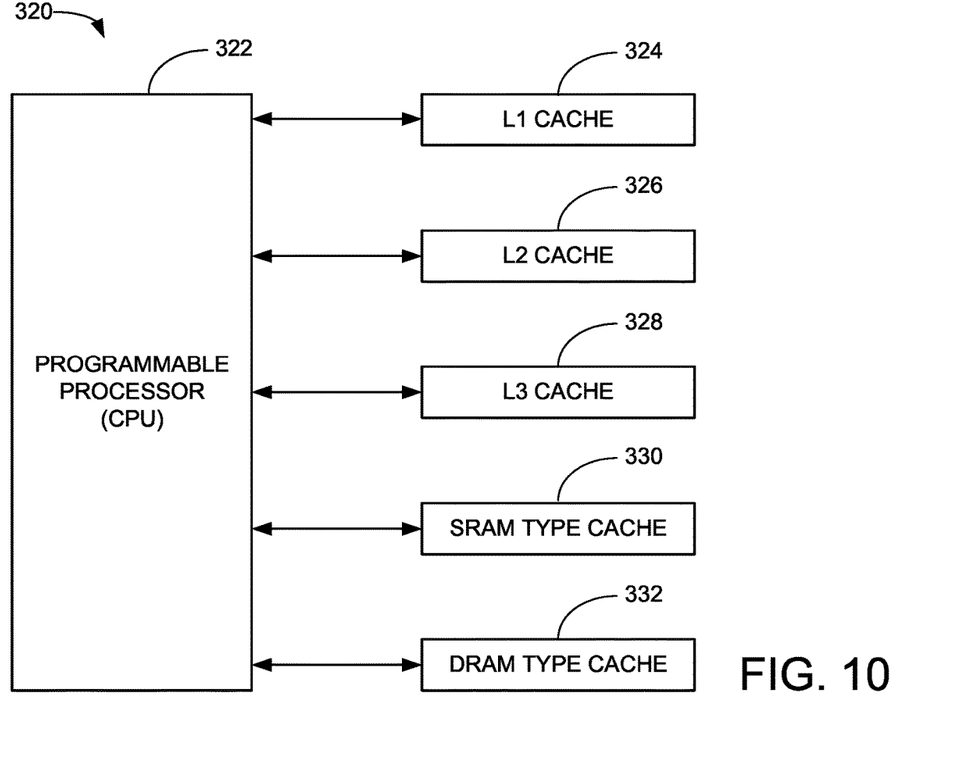
FIG. 10 shows a system having a programmable processor and various types of local memory constructed and operated in accordance with various embodiments.

FIG. 10 is another system 320 in accordance with some embodiments. The system 320 can generally correspond to a primary controller that includes a programmable processor 322, such as suitable for the systems described above in FIGS. 1-2. The programmable processor 322 has one or more central processing units (CPUs) that operate to execute program instructions stored in memory (e.g., firmware, software, apps, containers, programs, etc.). While not limiting, the program instructions can both utilize input data and generate output data, both of which can be stored in various locations (along with the program instructions). The processor can be single core, multi-core, distributed, hardware accelerated, etc.

FIG. 10 further shows an array of memory locations accessible by the programmable processor 322. These include a first level (L1) cache 324, a second level (L2) cache 326, a third level (L3) cache 328, an SRAM type cache 330 and a DRAM type cache 332. The L1, L2 and L3 caches can operate as known in the art to provide hierarchies of fast local memory for the processor. Each of these can be formed of any suitable memory including FME cells in a stack register as described above. The SRAM type cache 330 can be formed of SRAM or of FME cells in a stack register arrangement as described above. The DRAM type cache 332 can similarly be formed of DRAM or of FME cells in a stack register arrangement as described above.

Any number of different types of program instructions, control data and user data can be respectively loaded and used in the various memory locations in FIG. 10. As before, in at least some embodiments different forms of FME cells can make up the various memory locations, enabling different characteristics to be selected for different requirements.

It will now be appreciated that various embodiments of the present disclosure can provide certain benefits over the existing art. The use of FME cells of various constructions in one or more stack registers can enable efficient management of data storage and retrieval requirements. While operative environments have been presented in the context of a data storage application, including but not limited to an SSD, it will be appreciated that the various embodiments can be incorporated in substantially any number of different applications and environments.

It is to be understood that even though numerous characteristics and advantages of various embodiments of the present disclosure have been set forth in the foregoing description, this description is illustrative only, and changes may be made in detail, especially in matters of structure and arrangements of parts within the principles of the present disclosure to the full extent indicated by the broad general meaning of the terms wherein the appended claims are expressed.

What is claimed is:

1. A ferroelectric stack register memory comprising:
a first arrangement of ferroelectric memory cells (FMEs) having a first construction arranged to provide a first number of cache lines adapted to respectively receive a corresponding first number of data entries from a processor;
a second arrangement of FMEs having a different, second construction arranged to provide a second number of cache lines adapted to respectively receive a corresponding second number of data entries from the processor; and
a pointer mechanism configured to provide pointers to point to each of the respective first and second numbers of cache lines based on a time sequence of operation of the processor.

2. The memory of claim 1, wherein the first number of cache lines are formed of ferroelectric tunneling junction (FJT) memory cells.

3. The memory of claim 1, wherein the first number of cache lines are formed as ferroelectric random access memory (FeRAM) memory cells each having at least one transistor and at least one capacitor.

4. The memory of claim 3, wherein the at least one capacitor in each FeRAM memory cell has a ferroelectric layer.

5. The memory of claim 1, wherein the first number of cache lines are formed as ferroelectric field effect transistors (FeFETs).

6. The memory of claim 1, wherein the stack register is arranged as a plurality of ferroelectric layers separated by intervening non-ferroelectric layers arranged as a stack having an input end and an output end, and wherein a read/write advancement circuit is adapted to stepwise advance data bits to each of the ferroelectric layers from the input end to the output end to populate the stack.

7. The memory of claim 1, wherein the processor selects between the first and second sets of cache lines responsive to a type of data to be stored to the stack register.

8. The memory of claim 1, wherein the stack register forms a portion of a data storage device having a main non-volatile memory (NVM) to store user data from a client device.

9. The memory of claim 8, wherein the data storage device is a solid-state drive (SSD) in which the NVM is a flash memory.

10. The memory of claim 1, wherein the processor is characterized as a programmable processor which executes program instructions from a memory, and at least some of the program instructions are stored in the stack register prior to said execution thereof.

11. A data storage device, comprising:
a non-volatile memory (NVM) characterized as a main memory store for user data accessible by an external client device;
a controller configured to transfer the user data between the NVM and the external client device responsive to commands issued by the external client device; and
a local memory configured for use by the controller to support said transfers of the user data, the local memory characterized as a ferroelectric stack register memory comprising a first arrangement of ferroelectric memory cells (FMEs) having a first construction, a second arrangement of FMEs having a different, second construction, and a pointer mechanism configured to provide pointers to point to cache lines associated with each of the first and second arrangements of FMEs responsive to inputs supplied by the controller.

12. The data storage device of claim 11, wherein the NVM comprises at least a selected one of flash memory or rotatable magnetic recording media.

13. The data storage device of claim 11, wherein the controller comprises a programmable processor configured to execute program instructions stored in the stack register.

14. The data storage device of claim 11, wherein the local memory further comprises read/write circuitry configured to read data from and write data to the stack register, and refresh circuitry configured to selectively refresh data to the stack register after a read operation responsive to a mode selection input from the controller.

15. The data storage device of claim 11, wherein each of the first and second constructions are selected from FTJs, FeRAMs or FeFETs.

16. The data storage device of claim 11, wherein the controller stores a selected data set in the first arrangement of FMEs and subsequently transfers the selected data set to the second arrangement of FMEs.

17. A method comprising:
initiating communication between a controller and a ferroelectric stack register memory having a first arrangement of ferroelectric memory cells (FMEs) having a first construction arranged to provide a first number of cache lines adapted to respectively receive a corresponding first number of data entries from the processor and a second arrangement of FMEs having a different, second construction arranged to provide a second number of cache lines adapted to respectively receive a corresponding second number of data entries from the processor;

using the controller to store a first data set to the first number of cache lines of the first arrangement and a second data set to the second number of cache lines of the second arrangement; and utilizing a pointer mechanism to provide pointers to point to each of the respective first and second numbers of cache lines based on a time sequence of operation of the controller.

18. The method of claim 17, further comprising using the controller to migrate the first data set to the second number of cache lines of the second arrangement and updating the pointer mechanism to reflect said migration.

19. The method of claim 17, wherein each of the first and second constructions are selected from different ones of FTJs, FeRAMs or FeFETs.

20. The method of claim 17, wherein the stack register forms a portion of a data storage device having a main non-volatile memory (NVM) to store user data from a client device.

* * * * *